(12) United States Patent
Lee et al.

(10) Patent No.: US 8,971,047 B2
(45) Date of Patent: Mar. 3, 2015

(54) PRINTED CIRCUIT BOARD ASSEMBLY

(75) Inventors: Yong Won Lee, Suwon-si (KR); Tae Sang Park, Seoul (KR); Hyo Young Shin, Yongin-si (KR); Ji Young Jang, Incheon (KR); Young Jun Moon, Hwaseong-si (KR); Soon Min Hong, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 113 days.

(21) Appl. No.: 13/610,145

(22) Filed: Sep. 11, 2012

(65) Prior Publication Data

US 2013/0077265 A1 Mar. 28, 2013

(30) Foreign Application Priority Data

Sep. 28, 2011 (KR) .................. 10-2011-0098254

(51) Int. Cl.
| | |
|---|---|
| *H05K 1/00* | (2006.01) |
| *H05K 1/14* | (2006.01) |
| *H05K 3/28* | (2006.01) |
| *H05K 3/36* | (2006.01) |
| *H05K 5/06* | (2006.01) |
| *H05K 1/18* | (2006.01) |
| *H05K 3/32* | (2006.01) |

(52) U.S. Cl.
CPC .............. *H05K 1/147* (2013.01); *H05K 3/284* (2013.01); *H05K 3/361* (2013.01); *H05K 5/065* (2013.01); *H05K 1/189* (2013.01); *H05K 1/148* (2013.01); *H05K 3/323* (2013.01); *H05K 2201/055* (2013.01); *H05K 2203/1316* (2013.01)
USPC ........................................................ 361/749

(58) Field of Classification Search
USPC ......................................... 361/749, 803, 763
See application file for complete search history.

(56) References Cited

U.S. PATENT DOCUMENTS

| 3,934,074 A | 1/1976 | Evelove et al. |
| 2002/0014699 A1 | 2/2002 | Fujimura et al. |
| 2002/0071085 A1* | 6/2002 | Huang et al. .................. 349/149 |
| 2003/0030689 A1 | 2/2003 | Hashimoto et al. |

(Continued)

FOREIGN PATENT DOCUMENTS

| DE | 102004013056 | 10/2004 |
| EP | 1034983 | 9/2000 |
| JP | 06-037248 | 2/1994 |

(Continued)

OTHER PUBLICATIONS

Russian Office Action dated Aug. 25, 2014 in Russian Application 2012141224/07.

(Continued)

*Primary Examiner* — Andargie M Aychillhum
(74) *Attorney, Agent, or Firm* — Staas & Halsey LLP

(57) ABSTRACT

A printed circuit board assembly capable of having an electronic component mounted at a wafer level by using a wafer itself as a printed circuit board, the printed circuit board assembly including a plurality of electronic components, a printed circuit board having the plurality of electronic components mounted thereon, a protection body configured to entirely cover the printed circuit board, and a connection unit having one end that is exposed to an outside of the protection body for the printed circuit board to be electrically connected to a sub board, wherein the printed circuit board comprises a wafer printed circuit board formed with a wafer.

19 Claims, 9 Drawing Sheets

(56) References Cited

U.S. PATENT DOCUMENTS

| | | | |
|---|---|---|---|
| 2005/0041400 A1* | 2/2005 | Berberich et al. | ............ 361/749 |
| 2006/0244540 A1 | 11/2006 | Nakamura et al. | |

FOREIGN PATENT DOCUMENTS

| KR | 10-2007-0103141 | 10/2007 |
|---|---|---|
| KR | 10-2010-0011584 | 2/2010 |
| RU | 2049365 | 11/1995 |
| RU | 2190284 | 6/2000 |
| RU | 2312474 | 12/2007 |
| TW | 200802745 | 1/2008 |

OTHER PUBLICATIONS

Russian Office Action dated Dec. 24, 2013 in Russian Application 2012141224/07.

Extended European Search Report dated Aug. 7, 2014 in European Application No. 12185845.0.

* cited by examiner

PRINTED CIRCUIT BOARD ASSEMBLY

CROSS-REFERENCE TO RELATED APPLICATIONS

This application claims the priority benefit of Korean Patent Application No. 10-2011-0098254, filed Sep. 28, 2011 in the Korean Intellectual Property Office, the disclosure of which is incorporated herein by reference.

BACKGROUND

1. Field

Embodiments relate to a printed circuit board assembly capable of having a reduced size and a thinner thickness.

2. Description of the Related Art

Consumers are increasingly demanding miniature light weight electronic products, which also have a high performance and multi functionality. More particularly, in regard to a mobile apparatus, lightweight, miniaturization and slimness of an electronic product are considered important factors.

As above, for the miniaturizing and the slimming of the electronic product, a technology capable of having a thinner thickness of a PCB (Printed Circuit Board) positioned at an inside of a product and a PCBA (Printed Circuit Board Assembly) having the PCB is required.

A WLP (Wafer Level Package) is one of the technologies capable of achieving the above purposes. WLP technology is capable of simultaneously processing many semiconductor chips in a wafer, thereby reducing manufacturing cost. In addition, since the area of the semiconductor chips represents the area of a package, the package is further miniaturized.

With respect to the WLP technology, in a case that a semiconductor chip is mounted on a conventional printed circuit board, a separate interposer or a wiring is needed for an electrical connection, which causes difficulty.

In addition, in regard to the conventional printed circuit board, embodying a fine pattern was limited.

SUMMARY

In an aspect of one or more embodiments, there is provided a printed circuit board assembly capable of having an electronic component mounted at a wafer level by using a wafer itself as a printed circuit board.

In an aspect of one or more embodiments, there is provided a printed circuit board assembly capable of embodying a double-sided printed circuit board by using two printed circuit boards.

In an aspect of one or more embodiments, there is provided a printed circuit board assembly including a plurality of electronic components, a printed circuit board, a protection body, and a connection unit. The printed circuit board has the plurality of electronic components mounted thereon. The protection body is configured to entirely cover the printed circuit board. The connection unit has one end that is exposed to an outside of the protection body for the printed circuit board to be electrically connected to a sub board outside the protection body. The printed circuit board includes a wafer printed circuit board formed with a wafer.

The wafer printed circuit board may be formed with at least one of silicon, glass, ceramic, or an organic.

The organic may include a low coefficient thermal expansion (CTE) organic.

The plurality of electronic components may include a semiconductor chip of a wafer level.

The plurality of electronic components may be directly mounted on the wafer printed circuit board as the wafer level.

The connection unit may include a flexible printed circuit board.

The flexible printed circuit board may be provided at an end thereof with a first electrode configured to electrically and physically connect the flexible printed circuit board to the wafer printed circuit board.

The first electrode may be adhesively connected to the wafer printed circuit board by using a solder paste.

The first electrode may be adhesively connected to the wafer printed circuit board by using an anisotropic conductive film.

The plurality of electronic components may be mounted on both sides of the wafer printed circuit board.

The wafer printed circuit board may include a first wafer printed circuit board and a second wafer printed circuit board disposed on a rear surface of the first wafer printed circuit board, and the plurality of electronic components is mounted on each outer surface of the first wafer printed circuit board and the second wafer printed circuit board.

The first wafer printed circuit board may be connected to the second wafer printed circuit board by a flexible printed circuit board.

In an aspect of one or more embodiments, there is provided a printed circuit board assembly having a printed circuit board on which a plurality of electronic components is mounted thereon, wherein the printed circuit board is formed with a wafer.

The printed circuit board assembly may further include a protection body configured to entirely cover the printed circuit board in order to enhance a mechanical strength of the printed circuit board and to protect the plurality of electronic components mounted on the printed circuit board.

The printed circuit board assembly may further include a flexible printed circuit board having one end connected to the printed circuit board at an inside of the protection body and the other end exposed to the outside of the protection body in order for the printed circuit board to be electrically connected to an outside sub board.

The one end of the flexible printed circuit board may be directly attached to one surface of the printed circuit board.

The plurality of the electronic components may be mounted on the printed circuit board while in a state of a semiconductor chip of a wafer level.

In an aspect of one or more embodiments, there is provided a printed circuit board assembly includes a first printed circuit board, a second printed circuit board, a plurality of electronic components, a flexible printed circuit board, and a protection body. The first printed circuit board is formed by having a circuit embodied on a wafer. The second printed circuit board is formed by having a circuit embodied on a wafer and disposed on a rear surface of the first wafer printed circuit board while making contact with the back surface of the first wafer printed circuit board. The plurality of electronic components is mounted at least one of opposite surfaces of the first wafer printed circuit board and the second wafer printed circuit boards, the opposite surfaces oriented away from contact surfaces of the first wafer printed circuit board and the second wafer printed circuit boards. The flexible printed circuit board is configured to electrically connect the first printed circuit board to the second printed circuit board. The protection body is formed to entirely cover the first printed circuit board and the second printed circuit board that are coupled to each other while making contact with each other.

The plurality of electronic components may be directly mounted on the first wafer printed circuit board and the second wafer printed circuit board as a semiconductor chip at a wafer level.

The flexible printed circuit board may be directly attached to the first printed circuit board and the second printed circuit board.

In an aspect of one or more embodiments, there is provided a printed circuit board assembly includes a wafer printed circuit board, a plurality of semiconductor chips and a protection body. The wafer printed circuit board is formed by having a circuit embodied on a wafer. The plurality of semiconductor chips is directly mounted on at least one surface of both surfaces of the wafer printed circuit board as a wafer level. The protection body is formed to entirely cover the wafer printed circuit board.

The printed circuit board assembly may further include a flexible printed circuit board configured to electrically connect the wafer printed circuit board to a board outside of the protection body.

The flexible printed circuit board may be directly attached to be connected to the wafer printed circuit board.

A smaller and thinner printed circuit board assembly may be embodied by forming a printed circuit board as a wafer, mounting an electronic component on a printed circuit board at a wafer level, and directly adhesively connecting a flexible printed circuit board.

A double-sided printed circuit board may be embodied with a simple structure having two printed circuit boards stacked on top of one another.

In an aspect of one or more embodiments, there is provided a printed circuit board assembly, including a protection body configured to entirely cover the printed circuit board; and a connection unit having one end that is exposed to an outside of the protection body for the printed circuit board to be electrically connected to a sub board outside the protection body, wherein the printed circuit board comprises a wafer printed circuit board formed with a wafer.

The wafer printed circuit board may be re-wired in a fine pattern.

BRIEF DESCRIPTION OF THE DRAWINGS

These and/or other aspects of embodiments will become apparent and more readily appreciated from the following description of embodiments, taken in conjunction with the accompanying drawings of which.

DETAILED DESCRIPTION

Figure 1:
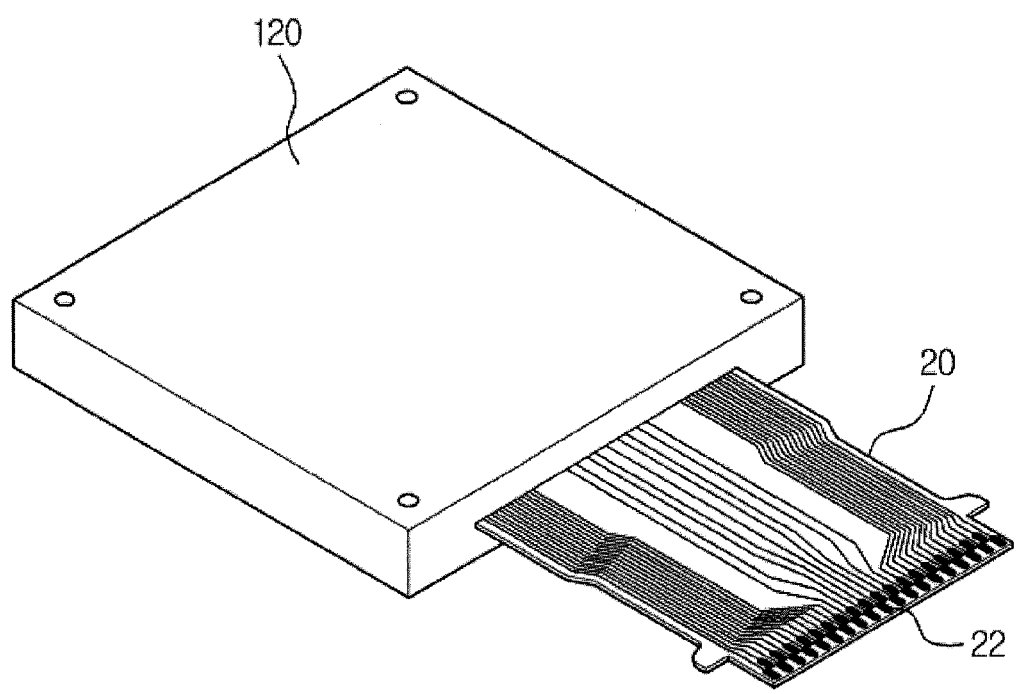
FIG. 1 is a view illustrating a structure of a printed circuit board assembly according to an embodiment.
Figure 2:
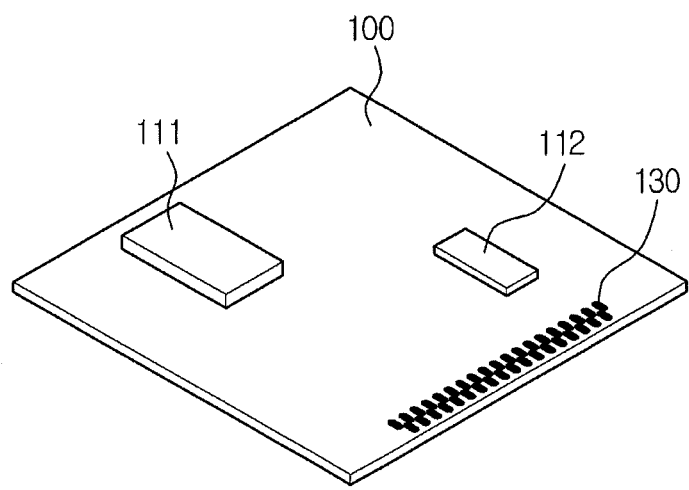
FIG. 2 is a view illustrating a printed circuit board having an electronic component mounted at an inside of the printed circuit board assembly of FIG. 1.
Figure 3:
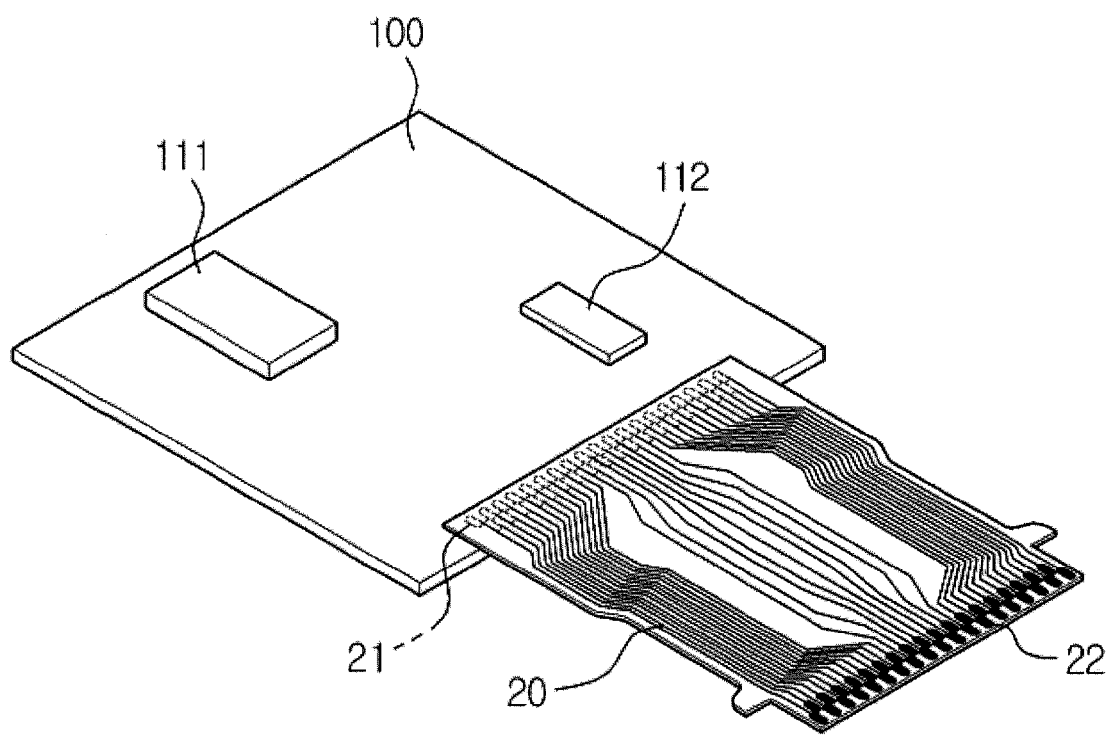
FIG. 3 is a view illustrating a flexible printed circuit board connected to the printed circuit board of FIG. 2.
Figure 4:
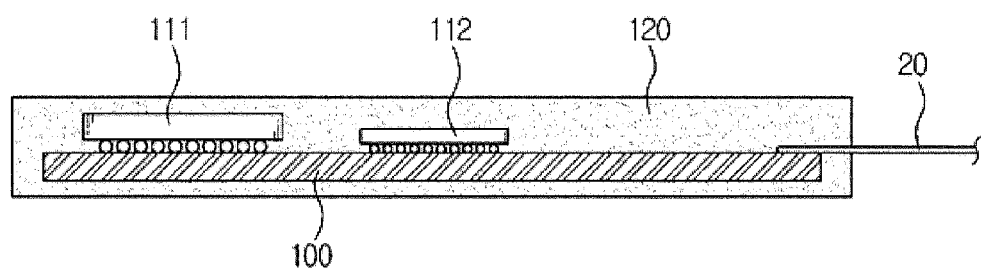
FIG. 4 is a cross-sectional view of the printed circuit board assembly of FIG. 1.

Reference will now be made in detail to embodiments, examples of which are illustrated in the accompanying drawings, wherein like reference numerals refer to like elements throughout.

As illustrated on FIGS. 1 to 4, a printed circuit board assembly 1 includes a printed circuit board 100, electronic components 111 and 112 mounted on the printed circuit board 100, and a flexible printed circuit board 20 connected to the printed circuit board 100.

A conventional printed circuit board is formed by printing a blue lead resist on after forming a wiring with a copper foil on a thin board serving as a basis that is made of an insulator such as epoxy resin or Bakelite resin.

The printed circuit board 100 according to an embodiment is a wafer printed circuit board formed by performing a re-wiring on a wafer.

According to the wafer printed circuit board 100, a circuit is formed by a semiconductor re-wiring process, and thus, may embody a fine pattern capable of mounting a fine pitch component that could not be embodied on the conventional printed circuit board.

Material of a wafer used for the wafer printed circuit board 100 may be silicon, glass, ceramic, or an organic. In particular, the organic matter may be a low coefficient thermal expansion (CTE) organic.

An electronic component is mounted on one surface of the wafer printed circuit board 100. Each of the electronic components 111 and 112 may be a component which comes in a package shape that is generally used, or a semiconductor chip at a wafer level. However, since an embodiment relates to the miniaturizing and the slimming of the printed circuit board assembly 1, each of the electronic component 111 and the electronic component 112 is desired to be the semiconductor chip at the wafer level.

In a case that each of the electronic component 111 and the electronic component 112 is the semiconductor chip at the wafer level, the electronic components 111 and 112 may be directly mounted on the wafer printed circuit board 100 by using a solder ball. Since the wafer printed circuit board 100 is formed with the wafer itself, mounting the semiconductor chip is easy. In regard to a difficulty with a wiring, since the circuit may be formed by performing a semiconductor re-wiring on the wafer printed circuit board 100, the wiring of the circuit having a fine pattern may be embodied.

An electrode for connection 130 configured for electrically connecting the wafer printed circuit board 100 to an outside sub board (not shown) is provided at one end edge of the wafer printed circuit board 100.

A flexible PCB (FPCB) 20 is connected to the electrode for connection 130 while making contact with the electrode for connection 130. The flexible PCB 20 is referred to as a board using a flexible insulation board.

The flexible PCB 20 may be formed by using a flexible material such as polyester (PET) or a heat resistance plastic film such as polyimide (PI).

An inner electrode 21 configured to be electrically and physically connected to the wafer printed circuit board 100 is formed at one end of the flexible PCB 20, and an outer electrode 22 configured to be electrically and physically connected to an outside sub board (not shown) is formed at the other end of the flexible PCB 20.

Different from the conventional printed circuit board where a separate connector is needed for connection with the flexible PCB 20, the wafer printed circuit board 100 according to an embodiment is directly attached to the flexible PCB 20 without the connector.

The flexible PCB 20 is attached to the wafer printed circuit board 100 by using an adhesive agent. As the inner electrode 21 of the flexible PCB 20 is attached to the electrode for connection 130 of the wafer printed circuit board 100 while making contact with each other, the flexible PCB 20 and the wafer printed circuit board 100 are electrically and physically connected to each other.

As for the adhesive agent, a solder paste or an Anisotropic Conductive Film (ACF) is used. Other than the adhesive agent as above, any other adhesive agent which is configured to electrically and physically connect the flexible PCB 20 to the wafer printed circuit board 100 are included in an aspect of an embodiment.

As above, by electrically and physically connecting the flexible PCB 20 to the wafer printed circuit board 100 without using the connector having large load and tall height, the miniaturizing and the slimming of the printed circuit board assembly 1 may be achieved.

Since the wafer printed circuit board 100 having the electronic components 111 and 112 mounted thereon and having the flexible PCB 20 connected thereto is weak against an outside impact, the wafer printed circuit board 100 is covered with a protection body 120 that is formed by entirely molding the wafer printed circuit board 100 with a resin.

Even if the protection body 120 covers the printed circuit board assembly 1, the outer electrode 22 of the flexible PCB 20 is needed to be connected to the outside sub board (not shown), thereby is exposed to the outside of the protection body 120.

The protection body 120 ensures enough of mechanical strength of the printed circuit board assembly 1, and at the same time, may be able to protect the electronic components 111 and 112.

Hereafter, a structure configured to embody a double-sided printed circuit board assembly in order for the printed circuit board assembly to be further miniaturized and integrated will be explained.

Figure 5:
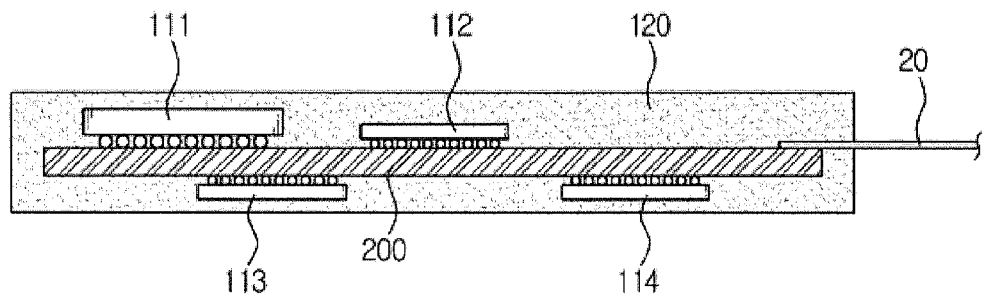
FIG. 5 is a cross-sectional view of a printed circuit board assembly according to an embodiment.

FIG. 5 is a cross-sectional view of a printed circuit board assembly 2*a* according to an embodiment.

As illustrated on FIG. 5, the printed circuit board assembly 2*a* comprises wafer printed circuit board 200. A circuit wiring is formed on both sides of a wafer printed circuit board 200, and electronic components 111, 112, 113, and 114 are mounted on the both sides of the wafer printed circuit board 200.

Each of the electronic components 111, 112, 113, and 114 is a semiconductor chip at a wafer level, and is directly mounted on the wafer printed circuit board 200 by using a solder ball.

The electrode for connection 130 (refer to FIG. 2) configured for the electrical connection to the outside sub board (not shown) is provided at the one side edge of the wafer printed circuit board 200, and the flexible PCB 20 is connected to the electrode for connection 130 while making contact with the electrode for connection 130.

One end of the flexible PCB 20 is electrically and physically connected to the wafer printed circuit board 200, and the other end of the flexible PCB 20 is electrically and physically connected to the outside sub board (not shown).

The flexible PCB 20 is attached to the wafer printed circuit board 200 by using the adhesive agent, and no separate connector is needed.

Figure 6A:
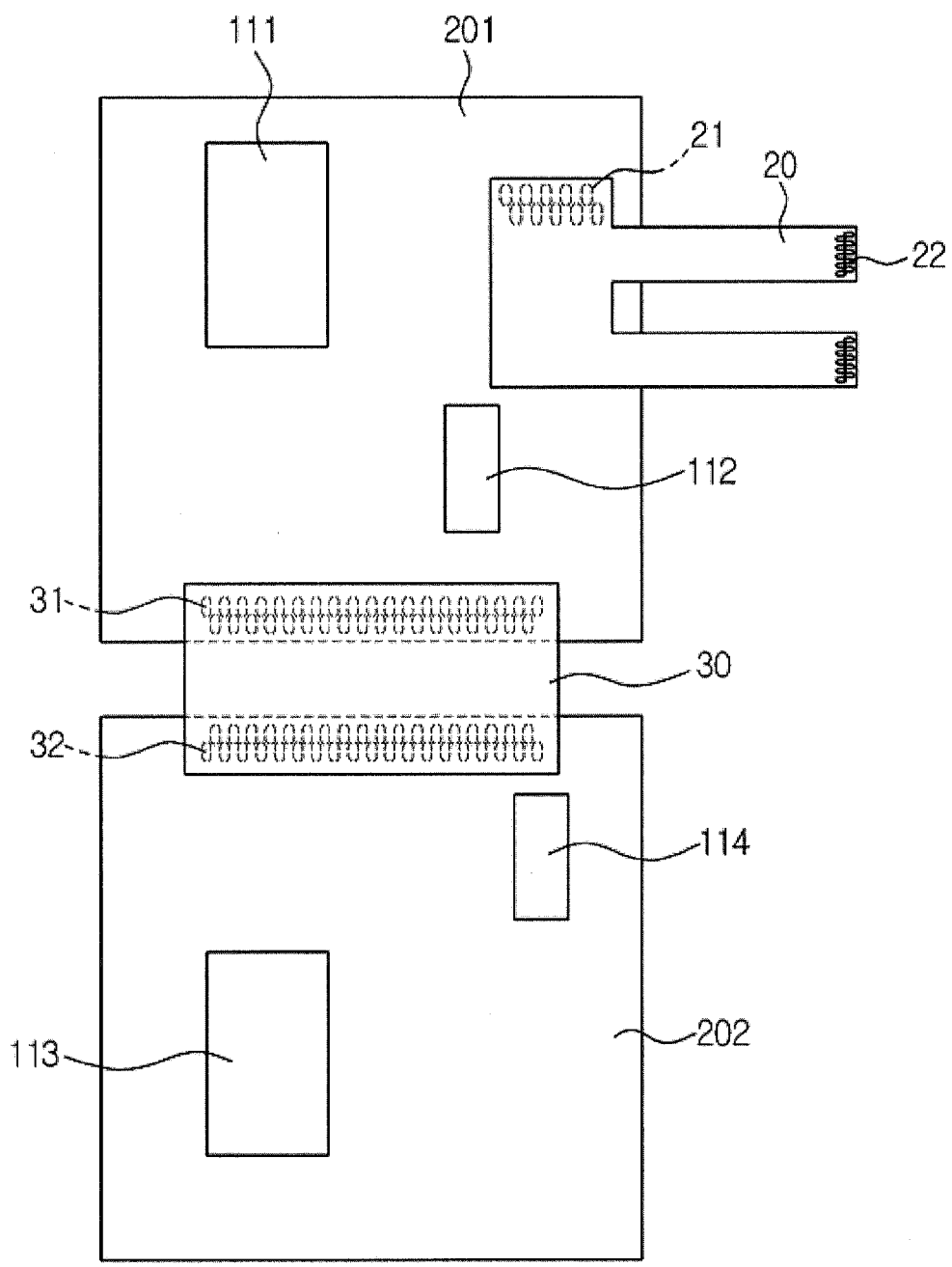
FIG. 6A is a view illustrating an inner structure of a printed circuit board assembly prior to a molding according to an embodiment.
Figure 6B:
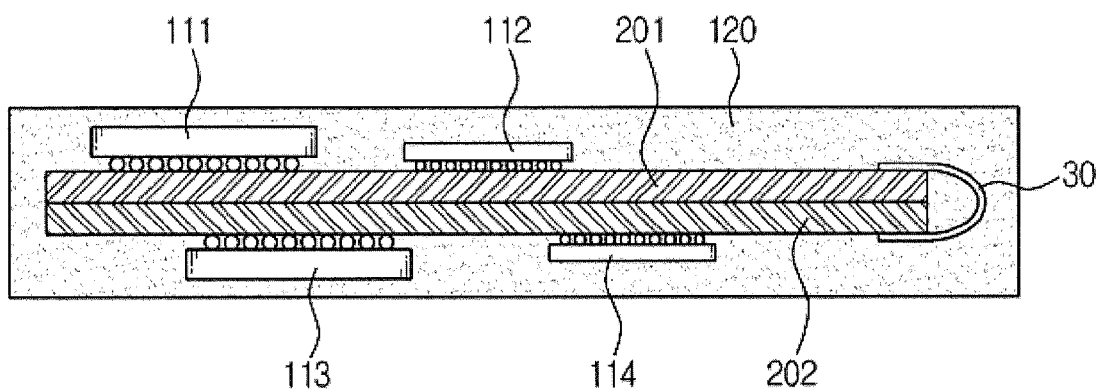
FIG. 6B is a cross-sectional view of the printed circuit board assembly according to FIG. 6A.

FIG. 6A is a view illustrating an inner structure of a printed circuit board assembly prior to a molding according to an embodiment. FIG. 6B is a cross-sectional view of the printed circuit board assembly according to FIG. 6A.

As illustrated on FIG. 6A, a first wafer printed circuit board 201 is electrically and physically connected to a second wafer printed circuit board 202 through a connection flexible printed circuit board 30.

Although not illustrated on a drawing, an electrode configured for being connected to the electrodes 30,31 of the connection flexible printed circuit board 30 is provided at each of the first wafer printed circuit board 201 and the second wafer printed circuit board 202.

The connection flexible printed circuit board 30 is attached to the first wafer printed circuit board 201 and the second wafer printed circuit board 202 by using the adhesive agent, and no separate connector is needed.

The electronic components 111, 112, 113, and 114 formed with a semiconductor chip at a wafer level are mounted at each of one side of the first wafer printed circuit board 201 and the second wafer printed circuit board 202.

As described above, the electronic components 111,112, 113, and 114 are directly mounted on the wafer printed circuit board 200 as a wafer level by using the solder ball.

The electrode for connection 120 (refer to FIG. 3) configured for the electrical connection to the outside sub board (not shown) is provided at the one side edge of the first wafer printed circuit board 201, and the flexible PCB 20 is connected to the electrode for connection 120 while making contact with the electrode for connection 120.

One end of the flexible PCB 20 is electrically and physically connected to the wafer printed circuit board 200, and the other end of the flexible PCB 20 is electrically and physically connected to the outside sub board (not shown).

The flexible PCB 20 is attached to the wafer printed circuit board 200 by using the adhesive agent, and no separate connector is needed, as previously explained.

As illustrated on FIG. 6B, by folding the connection flexible printed circuit board 30 such that rear surfaces of the first wafer printed circuit board 201 and the second wafer printed circuit board 202 face each other, the rear surfaces not having the electronic components 111, 112, 113, and 114 mounted thereon, the same effect is attained as the electronic components 111, 112, 113, and 114 are mounted at both sides.

Since the thickness of each of the first wafer printed circuit board 201 and the second wafer printed circuit board 202 is not thick, the thickness of the first wafer printed circuit board 201 and the second wafer printed circuit board 202 stacked on top of one another does not become thicker.

In order to manufacture the double-sided printed circuit board according to an embodiment shown on FIG. 5, a separate process is needed. However, according to an embodiment shown in FIG. 6A, the same degree of integration as the double sided printed circuit board is achieved by using a general one sided wafer printed circuit board.

In a case that the printed circuit board assembly is composed as above, since there is no need to conduct a wiring process twice on each side of a single wafer printed circuit board, a cost reduction effect may be achieved.

The protection body 120 is formed by entirely molding the first wafer printed circuit board 201 and the second wafer printed circuit board 202 stacked on top of one another by using the resin. The protection body 120 ensures enough of mechanical strength of the printed circuit board assembly 2*b*, thereby having stability, and at the same time, may be able to protect the electronic components 111, 112, 113, and 114.

Although not clearly illustrated on FIG. 6B, however, as previously examined, the flexible printed circuit board 20 is needed to be connected to the outside sub board (not shown), thereby is exposed to the outside of the protection body 120.

Hereafter, a connecting method between the printed circuit board assembly and the outside sub board will be explained.

Figure 7:
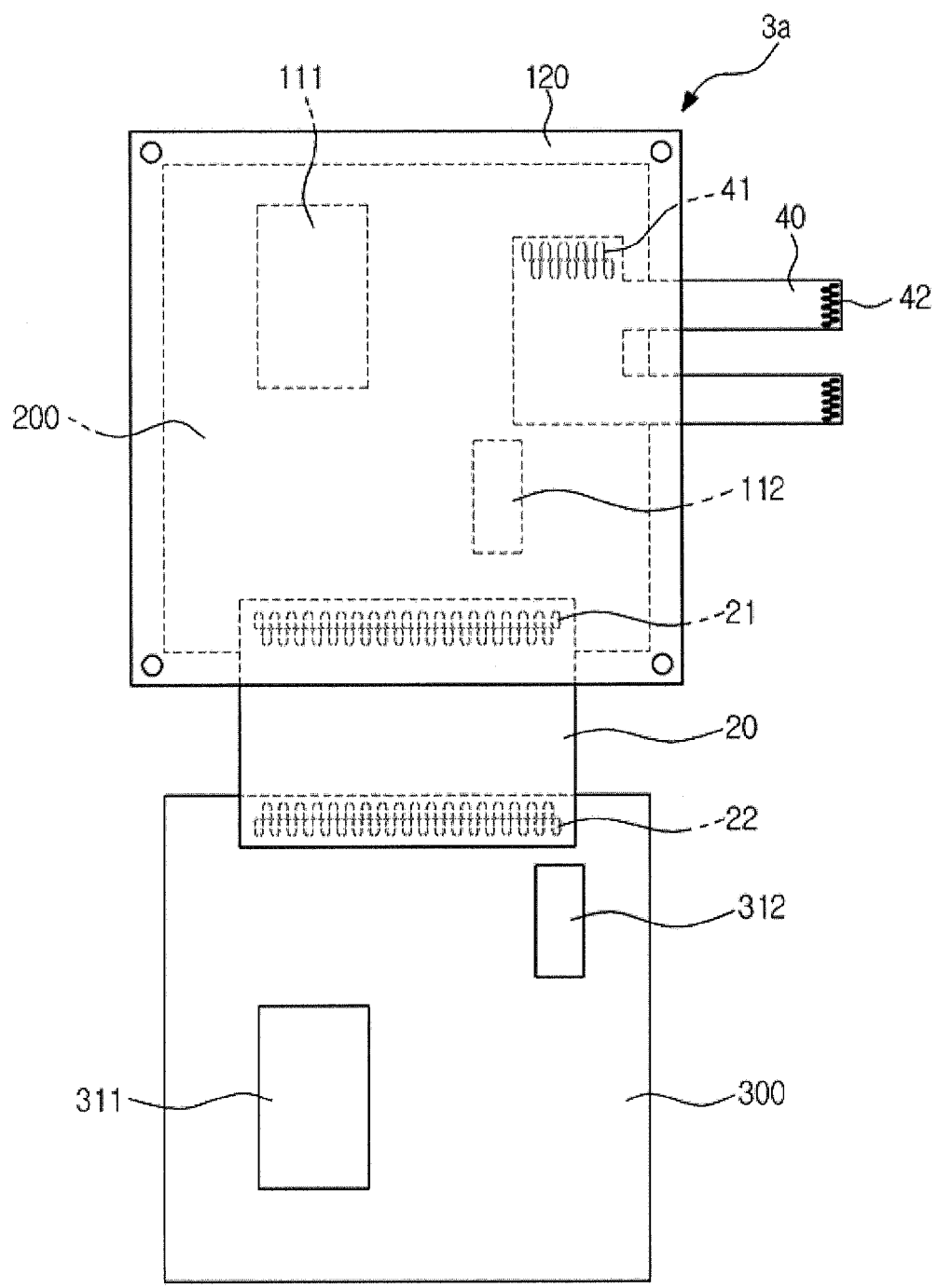
FIG. 7 is a view showing a connection relation of a printed circuit board assembly according to an embodiment.

FIG. 7 is a view showing a connection relation of a printed circuit board assembly according to an embodiment and a sub board.

As illustrated on FIG. 7, a printed circuit board assembly 3a includes the wafer printed circuit board 200, electronic components 111, and 112, mounted at the wafer printed circuit board 200, the flexible PCB 20 and a flexible PCB 40. The printed circuit board 200 according to an embodiment represents a wafer printed circuit board at which a circuit wiring is formed by conducting are-wiring on the wafer.

Electronic components are mounted on one surface of the wafer printed circuit board 200. Each of the electronic components 111 and 112 may be a component which comes in a package shape that is generally used, or a semiconductor chip at a wafer level.

Particularly, in a case that the electronic component is provided as a wafer level such as a semiconductor chip, the electronic component is directly mounted at the wafer printed circuit board 200 without a separate interposer or the wiring.

A first electrode for connection (not shown) is provided at one side edge of the wafer printed circuit board 200 for the electrical and physical connection to an outside sub board 300. The first flexible PCB 20 is connected to the first electrode for connection (not shown) while making contact with the first electrode.

A second electrode for connection (not shown) is provided at the other side edge of the wafer printed circuit board 200 for the electrical and physical connection with another board (not shown). The second flexible PCB 40 is connected to the second electrode for connection (not shown) while making contact with the second electrode.

The first flexible PCB 20 and the second first flexible PCB 40 include an inner electrode 21 and an inner electrode 41, respectively, for the connection with the wafer printed circuit board 200, and an outer electrode 22 and an outer electrode 42, respectively, for the connection with the outside board.

The first flexible PCB 20 and the second flexible PCB 40 are attached to the wafer printed circuit board 200 by using the adhesive agent. As for the adhesive agent, the solder paste or the Anisotropic Conductive Film (ACF) is used.

By electrically and physically connecting the first flexible PCB 20 and the second flexible PCB 40 without using the connector, the miniaturizing and the slimming of the printed circuit board assembly 3a may be achieved.

The wafer printed circuit board 200 having the electronic components 111 and 112 mounted thereon and the first flexible PCB 20 and the second flexible PCB 40 connected thereto is entirely molded with a resin, thereby forming the protection body 120 that is configured to form an exterior of the printed circuit board assembly 3a and absorb impact.

Even if the protection body 120 covers the printed circuit board assembly 3a, the outer electrodes 22 and 42 of each of the first flexible PCB 20 and the second flexible PCB 40 are exposed to the outside of the protection body 120.

The outside sub board 300 is connected to the outer electrode 22 of the first flexible PCB 20 which is exposed to the outside of the protection body 120.

In an aspect of an embodiment, the outside sub board 300 is a wafer printed circuit board formed with a wafer. In a case that the outside sub board 300 is the wafer printed circuit board, the outer electrode 22 of the first flexible printed circuit board 20 is directly connected to the outside sub board 300 without a structure such as a connector.

Electronic components 311 and 312 may be directly mounted at the outside sub board 300 in the form of a semiconductor chip at a wafer level.

Such outside sub board 300, as is with the printed circuit board assembly 3a, is desired to be entirely covered with the protection body (not shown) through the resin molding.

Figure 8:
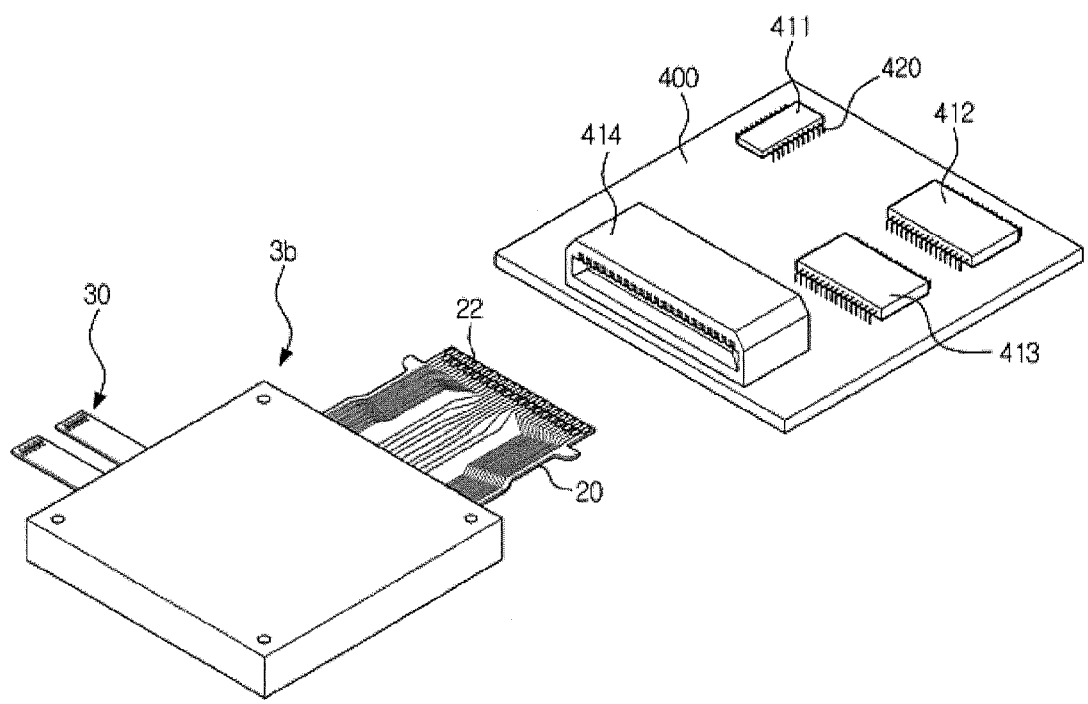
FIG. 8 is a view showing a connection relation of a printed circuit board assembly an embodiment.

FIG. 8 is a view showing a connection relation of a printed circuit board assembly an embodiment and a sub board.

As illustrated on FIG. 8, according to a printed circuit board assembly 3b, the protection body 120 configured to entirely cover a wafer printed circuit board (not shown) having an electronic component mounted thereon forms the exterior of the printed circuit board assembly 3b. One end of each of the first flexible PCB 20 which is configured for connection to an outside sub board 400 and the second flexible PCB is exposed to the outside of the protection body 120.

The outer electrode 22 is formed at the one end of the first flexible PCB 20 for the connection to the outside sub board 400.

The outside sub board 400 according to this embodiment is a printed circuit board formed by using epoxy resin or Bakelite resin as a basis. Thus, different from the previous embodiment, the outer electrode 22 of the first flexible printed circuit board 20 may not be directly connected to the outside sub board 400 while making a contact with the outside sub board 400.

Therefore, a connector 414 configured for the electrical and physical connection to the first flexible printed circuit board 20 is mounted at the outside sub board 400.

As the outer electrode 22 of the first flexible printed circuit board 20 is inserted into the connector 414, the first flexible printed circuit board 20 and the outside sub board 400 are connected to each other. Accordingly, the printed circuit board assembly 3b is electrically connected to the outside sub board 400.

Since the outside sub board 400 is a general printed circuit board, electronic components 411, 412, and 413 may not be mounted as a wafer level, but are mounted in the form of a general package shape on the outside sub board 400.

In detail, a plurality of lead wires 420 configured for the electrical connection with the outside sub board 400 is protruded from the electronic components 411, 412, and 413, to an outside. As the lead wire 420 is soldered to the sub board 400, the electronic components 411, 412, and 413 are physically fixed to the sub board 400, and at the same time, are electrically connected to the sub board 400.

Only by having a main board of an electronic apparatus smaller and thinner, the electronic apparatus may be reduced in size. Therefore, only by composing the main board with the printed circuit board assembly 3b according to an embodiment and by composing sub boards with the conventional printed circuit board, the miniaturizing and the slimming of the electronic apparatus may be achieved.

Although a few embodiments have been shown and described, it would be appreciated by those skilled in the art that changes may be made in these embodiments without departing from the principles and spirit of the disclosure, the scope of which is defined in the claims and their equivalents.

What is claimed is:

1. A printed circuit board assembly, comprising:
  a plurality of electronic components;
  a printed circuit board having the plurality of electronic components mounted thereon;
  a protection body configured to entirely cover the printed circuit board; and a flexible printed circuit board having one end that is exposed to an outside of the protection body for the printed circuit board to be electrically connected to a sub board outside the protection body,
wherein the printed circuit board comprises a wafer printed circuit board formed with a wafer, and
wherein the wafer printed circuit board is directly attached to the flexible printed circuit board without a separate connector.

2. The printed circuit board assembly of claim 1, wherein the wafer printed circuit board is formed with at least one of silicon, glass, ceramic, and an organic.

3. The printed circuit board assembly of claim 2, wherein the organic includes a low coefficient thermal expansion (CTE) organic.

4. The printed circuit board assembly of claim 1, wherein the plurality of electronic components comprises a semiconductor chip of a wafer level.

5. The printed circuit board assembly of claim 4, wherein the plurality of electronic components is directly mounted on the wafer printed circuit board as the wafer level.

6. The printed circuit board assembly of claim 1, wherein the flexible printed circuit board is provided at other end thereof with a first electrode configured to electrically and physically connect the flexible printed circuit board to the wafer printed circuit board.

7. The printed circuit board assembly of claim 6, wherein the first electrode is adhesively connected to the wafer printed circuit board by using a solder paste.

8. The printed circuit board assembly of claim 6, wherein the first electrode is adhesively connected to the wafer printed circuit board by using an anisotropic conductive film.

9. The printed circuit board assembly of claim 1, wherein the plurality of electronic components is mounted on both sides of the wafer printed circuit board.

10. The printed circuit board assembly of claim 1, wherein the wafer printed circuit board comprises a first wafer printed circuit board and a second wafer printed circuit board disposed on a rear surface of the first wafer printed circuit board, and
the plurality of electronic components is mounted on each outer surface of the first wafer printed circuit board and the second wafer printed circuit board.

11. The printed circuit board assembly of claim 10, wherein the first wafer printed circuit board is connected to the second wafer printed circuit board by the flexible printed circuit board.

12. A printed circuit board assembly comprising:
a printed circuit board on which a plurality of electronic components is mounted thereon, wherein the printed circuit board is formed with a wafer;
a protection body configured to entirely cover the printed circuit board in order to enhance a mechanical strength of the printed circuit board and to protect the plurality of electronic components mounted on the printed circuit board; and
a flexible printed circuit board having one end connected to the printed circuit board at an inside of the protection body and the other end exposed to the outside of the protection body in order for the printed circuit board to be electrically connected to an outside sub board outside of the protection body,
wherein the printed circuit board is directly attached to the flexible printed circuit board without a separate connector.

13. The printed circuit board assembly of claim 12, wherein the plurality of the electronic components is mounted on the printed circuit board while in a state of a semiconductor chip of a wafer level.

14. A printed circuit board assembly, comprising:
a first printed circuit board formed by having a circuit embodied on a wafer;
a second printed circuit board formed by having a circuit embodied on a wafer and disposed on a rear surface of the first wafer printed circuit board while making contact with the back surface of the first wafer printed circuit board;
a plurality of electronic components mounted on at least one of opposite surfaces of the first wafer printed circuit board and the second wafer printed circuit board, the opposite surfaces oriented away from contact surfaces of the first wafer printed circuit board and the second wafer printed circuit boards;
a flexible printed circuit board configured to electrically connect the first printed circuit board to the second printed circuit board; and
a protection body formed to entirely cover the first printed circuit board and the second printed circuit board that are coupled to each other while making contact with each,
wherein the first printed circuit board is directly attached to the flexible printed circuit board without a separate connector.

15. The printed circuit board assembly of claim 14, wherein
the plurality of electronic components is directly mounted on the first wafer printed circuit board and the second wafer printed circuit board as a semiconductor chip at a wafer level.

16. The printed circuit board assembly of claim 14, wherein the flexible printed circuit board is directly attached to the first printed circuit board and the second printed circuit board.

17. A printed circuit board assembly comprising:
a wafer printed circuit board formed by having a circuit embodied on a wafer;
a plurality of semiconductor chips directly mounted on at least one surface of both surfaces of the wafer printed circuit board as a wafer level;
a protection body formed to entirely cover the wafer printed circuit board; and
a flexible printed circuit board configured to electrically connect the wafer printed circuit board to a board outside of the protection body,
wherein the flexible printed circuit board is directly attached to the wafer printed circuit board without a separate connector.

18. A printed circuit board assembly, comprising:
a protection body configured to entirely cover the printed circuit board; and
a flexible printed circuit board having one end that is exposed to an outside of the protection body for the printed circuit board to be electrically connected to a sub board outside the protection body,
wherein the printed circuit board comprises a wafer printed circuit board formed with a wafer, and
wherein the flexible printed circuit board is directly attached to be connected to the printed circuit board.

19. The printed circuit board assembly of claim 18, wherein the wafer printed circuit board is re-wired in a fine pattern.

* * * * *